United States Patent
Mirsaidov et al.

(10) Patent No.: US 11,906,946 B2
(45) Date of Patent: Feb. 20, 2024

(54) SYSTEM AND METHOD FOR CONTROLLING DIRECTIONALITY OF FAST-WET ETCHING OF CRYSTALLINE SILICON, C-SI

(71) Applicants: National University of Singapore, Singapore (SG); Agency for Science, Technology and Research, Singapore (SG)

(72) Inventors: Utkur Mirsaidov, Singapore (SG); Michel Bosman, Singapore (SG); Tanmay Ghosh, Singapore (SG); Zainul Aabdin, Singapore (SG); Frank Holsteyns, Leuven (BE); Antoine Pacco, Leuven (BE)

(73) Assignees: NATIONAL UNIVERSITY OF SINGAPORE, Singapore (SG); AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 84 days.

(21) Appl. No.: 17/496,111

(22) Filed: Oct. 7, 2021

(65) Prior Publication Data
US 2022/0113701 A1    Apr. 14, 2022

(30) Foreign Application Priority Data

Oct. 8, 2020   (SG) ............................ 10202009980T

(51) Int. Cl.
*G05B 19/4099*   (2006.01)
(52) U.S. Cl.
CPC .................... *G05B 19/4099* (2013.01); *G05B 2219/45031* (2013.01)

(58) Field of Classification Search
CPC ...... G05B 19/4099; G05B 2219/45031; B82Y 10/00; H01L 29/045; H01L 21/30608; H01L 29/0676
USPC ........ 700/121; 438/689; 257/21.223; 216/83
See application file for complete search history.

(56) References Cited

U.S. PATENT DOCUMENTS

| 2001/0038063 A1* | 11/2001 | Mitsuoka | B82Y 35/00 250/201.3 |
| 2003/0003759 A1* | 1/2003 | Kudelka | H10B 12/0387 257/E21.223 |
| 2013/0062015 A1* | 3/2013 | Cheng | H01L 21/6734 29/559 |

OTHER PUBLICATIONS

González-Pereyra, "Anisotropic etching of monocrystalline silicon under subcritical conditions", Dissertation for Doctor of Philosophy, Materials Science and Engineering, the Graduate School of Clemson University, Apr. 2015 (Year: 2015).*

Chen J., et. al., "Study of anisotropic etching of (1 0 0) Si with ultrasonic agitation", Sensors and Actuators A 96 (2002) 152-156 (Year: 2002).*

(Continued)

*Primary Examiner* — Thomas C Lee
*Assistant Examiner* — Michael Tang
(74) *Attorney, Agent, or Firm* — Mark H. Whittenberger; Holland & Knight LLP

(57) ABSTRACT

This document describes a system and method for selectively switching the fast-wet-etching direction of crystalline silicon, c-Si, nanostructures between the (100) and the (110) crystallographic planes of c-Si by a simple method of sample agitation. This method effectively allows the invention to achieve anisotropic and isotropic wet-etching of c-Si.

8 Claims, 6 Drawing Sheets

(56) References Cited

OTHER PUBLICATIONS

Tanaka H., et. al., "Si (100) and (110) etching properties in 5, 15, 30 and 48 wt% KOH", Microsyst Technol (2017) 23:5343-5350 (Year: 2017).*

Pal P., et. al., "Anisotropic etching in low-concentration KOH effects of surfactant concentration", Micro & Nano Letters, 2015, vol. 10, Iss. 4, pp. 224-228 (Year: 2015).*

\* cited by examiner

SYSTEM AND METHOD FOR CONTROLLING DIRECTIONALITY OF FAST-WET ETCHING OF CRYSTALLINE SILICON, C-SI

RELATED APPLICATIONS

This application claims the benefit of Singapore Patent Application No. 10202009980T, filed on 8 Oct. 2020. The content of which is incorporated by reference herein.

Field of the Invention

This invention relates to a system and method for selectively switching the fast-wet-etching direction of crystalline silicon, c-Si, nanostructures between the (100) and the (110) crystallographic planes of c-Si by a simple method of sample agitation. This method effectively allows the invention to achieve anisotropic and isotropic wet-etching of c-Si.

Summary of Prior Art

Modern microprocessors comprising billions of precisely engineered Si-based transistors rely on advanced semiconductor nanofabrication. To keep up with the demand for fast and efficient microprocessors, their performance is boosted by continuously increasing the on-chip density of the transistors. In previous and current-generations planar and fin-shaped field-effect transistors (FinFETs), the increase in the density is typically achieved by reducing the lateral dimensions of the transistor. While this approach to scaling worked very well in the past, it is now reaching its limit with critical transistor dimensions approaching a few tenths of atoms.

In order to address the limitations of this classical dimensional scaling, transistor architectures have evolved to stacked horizontal and vertical gate-all-around field-effect transistors (GAAFETs). In addition to being better suited for further scaling and integration, the electrostatic performance of GAAFETs is significantly better than those of FinFETs. However, vertical GAAFET technology relies heavily on the fabrication of high-density periodic arrays of vertical circular nanowires, which require new fabrication processes.

At present, three-dimensional Si nanostructures, including vertical nanowire structures, are produced by plasma-based dry reactive ion etching. Unfortunately, dry etching has a fundamental limitation—the use of energetic ions tend to cause unavoidable damage to the surface. As the dimensions of these nanostructures and their surface-to-volume ratio increase with every new device generation, the relative effect of the surface damage from dry etching becomes a limiting factor on device performance.

As a result, alternative approaches to dry etching are needed to produce nanostructures free from any surface damage. Hence, those skilled in the art have turned to wet chemical etching techniques. In contrast to dry etching, in a wet chemical etching process, the surface atoms are removed through a direct chemical reaction of the surface atoms with the etchant. The advantage of this process is that it does not leave a damaged layer at the silicon surface and can serve as a better alternative to dry etching. Furthermore, at an industrial level, wet etching has several advantages. The wet etching process allows multiple wafers to be processed at once and is able to produce more uniform etching characteristics as compared to dry etching techniques.

The two most commonly used etching solutions for wet chemical etching of crystalline silicon (c-Si) are potassium hydroxide (KOH) and tetra-methyl-ammonium hydroxide (TMAH) solutions. The main issue with both of these alkaline etchants is that they etch the c-Si anisotropically, as the etch rates for c-Si are different along different crystallographic directions. While the differences in etch rates are used to generate unique 3D structures, such as trenches, surface texture, cantilevers, and other micro-electro-mechanical systems (MEMS), anisotropic etching prevents the fabrication of well-defined vertical circular nanowires needed for GAAFET designs. Hence, it is important to develop controlled etching processes to selectively switch the fast-etch directions between different crystal planes.

Those skilled in the art have tried several approaches to alter the etch anisotropy for c-Si, such as by adding metal impurities to the etching solutions, adding alcohol, introducing light during the etching process, irradiating the c-Si using microwaves, using corner compensation techniques, and/or applying ultrasonic irradiation. However, none of these approaches succeeded in controllably switching the wet-etch anisotropy of c-Si.

For the above reasons, those skilled in the art are constantly striving to come up with a system and method that is able to selectively switch the fast-wet-etching direction of crystalline silicon, c-Si, between a (100) crystallographic plane of the c-Si and a (110) crystallographic plane of the c-Si without having the need to change and/or replace the etching solution being used.

SUMMARY OF THE INVENTION

The above and other problems are solved and an advance in the art is made by systems and methods provided by embodiments in accordance with the invention.

A first advantage of embodiments of systems and methods in accordance with the invention is that the invention is able to switch the fast etch directions between the (100) crystallographic plane of the c-Si and the (110) crystallographic plane of the c-Si without the need to change and/or replace the etching solution being used, without the need to increase the temperature of the etching solution and/or the concentration of the etching solution.

A second advantage of embodiments of systems and methods in accordance with the invention is that the invention is able to produce sub-10-nm diameter monocrystalline vertical Si nanowires with circular profiles, instead of anisotropic square profiles. This new level of design control forms an important step in the realization of vertical GAAFETs.

A third advantage of embodiments of systems and methods in accordance with the invention is that the invention allows for isotropic etch profiles to be carefully and accurately formed on vertical nanowires.

The above advantages are provided by embodiments of a method in accordance with the invention operating in the following manner.

According to a first aspect of the invention, a method for controlling directionality of fast-wet-etching of crystalline silicon, c-Si, is disclosed, the method comprising the steps of: anisotropically wet-etching the c-Si along a (100) crystallographic plane of the c-Si using an etching solution that wet-etches the c-Si along the (100) crystallographic plane at a faster rate than the c-Si along a (110) crystallographic plane of the c-Si; and increasing the rate of removal of etching byproducts from the (110) crystallographic plane of the wet-etched c-Si to cause the wet-etching of the c-Si along the (110) crystallographic plane to be at a faster rate than the wet-etching of the c-Si along the (100) crystallographic plane of the c-Si.

In accordance with the first aspect of the invention, the etching solution comprises potassium hydroxide (KOH) and the etching byproducts from the wet-etched c-Si comprises orthosilicic acid, Si(OH)$_4$.

In accordance with the first aspect of the invention, the step of increasing the rate of removal of the etching byproducts from the (110) crystallographic plane of the wet-etched c-Si comprises: agitating the etching solution such that the etching solution fluid contacts the c-Si along a direction parallel to the (110) crystallographic plane of the c-Si.

In accordance with the first aspect of the invention, the step of increasing the rate of removal of the etching byproducts from the (110) crystallographic plane of the wet-etched c-Si comprises: applying an oscillatory force to the c-Si such that the c-Si oscillates for part of the time along a direction parallel to the (110) crystallographic plane of the c-Si.

In accordance with the first aspect of the invention, the method further comprises the step of: reducing the rate of removal of etching byproducts from the (110) crystallographic plane of the wet-etched c-Si to cause the wet-etching of the c-Si along the (110) crystallographic plane to be at a slower rate than the wet-etching of the c-Si along the (100) crystallographic plane of the c-Si.

In accordance with the first aspect of the invention, the KOH solution comprises concentration levels <10% (w/v), preferably between 1-4% (w/v)) and is maintained at a temperature range between 20° C.-30° C., preferably 22° C.

According to a second aspect of the invention, a system for controlling directionality of fast-wet-etching of crystalline silicon, c-Si, is disclosed, the system comprising: a wet-etching setup configured to: anisotropically wet-etch the c-Si along a (100) crystallographic plane of the c-Si using an etching solution that wet-etches the c-Si along the (100) crystallographic plane at a faster rate than the c-Si along a (110) crystallographic plane of the c-Si; and increase the rate of removal of etching byproducts from the (110) crystallographic plane of the wet-etched c-Si to cause the wet-etching of the c-Si along the (110) crystallographic plane to be at a faster rate than the wet-etching of the c-Si along the (100) crystallographic plane of the c-Si.

In accordance with the second aspect of the invention, the etching solution comprises potassium hydroxide (KOH) and the etching byproducts from the wet-etched c-Si comprises orthosilicic acid, Si(OH)$_4$.

In accordance with the second aspect of the invention, increasing the rate of removal of the etching byproducts from the (110) crystallographic plane of the wet-etched c-Si comprises the wet-etching setup being further configured to: agitate the etching solution such that the etching solution fluid contacts the c-Si along a direction parallel to the (110) crystallographic plane of the c-Si.

In accordance with the second aspect of the invention, increasing the rate of removal of the etching byproducts from the (110) crystallographic plane of the wet-etched c-Si comprises the wet-etching setup being further configured to: apply an oscillatory force to the c-Si such that the c-Si oscillates for part of the time along a direction parallel to the (110) crystallographic plane of the c-Si.

In accordance with the second aspect of the invention, the wet-etching setup is further configured to: reduce the rate of removal of etching byproducts from the (110) crystallographic plane of the wet-etched c-Si to cause the wet-etching of the c-Si along the (110) crystallographic plane to be at a slower rate than the wet-etching of the c-Si along the (100) crystallographic plane of the c-Si.

In accordance with the second aspect of the invention, the KOH solution comprises concentration levels <10% (w/v), preferably between 1-4% (w/v)) and is maintained at a temperature range between 20° C.-30° C., preferably 22° C.

BRIEF DESCRIPTION OF THE DRAWINGS

The above and other problems are solved by features and advantages of a system and method in accordance with the present invention described in the detailed description and shown in the following drawings.

DETAILED DESCRIPTION

This invention relates to a system and method for selectively switching the fast-wet-etching direction of an array of crystalline silicon, c-Si, nanostructures between a (100) crystallographic plane of the c-Si and a (110) crystallographic plane of the c-Si by a simple method of sample agitation when the etching solution comprises a solution that wet-etches the c-Si anisotropically i.e. different planes are etched at different etch rates. It should be noted that the etching solution or the concentration of the solution is not changed throughout the entire selective switching process.

The present invention will now be described in detail with reference to several embodiments thereof as illustrated in the accompanying drawings. In the following description, numerous specific features are set forth in order to provide a thorough understanding of the embodiments of the present invention. It will be apparent, however, to one skilled in the art, that embodiments may be realised without some or all of the specific features. Such embodiments should also fall within the scope of the current invention. Further, certain process steps and/or structures in the following may not have been described in detail, and the reader may be referred to a corresponding term of art so as to not obscure the present invention unnecessarily.

Figure 1:
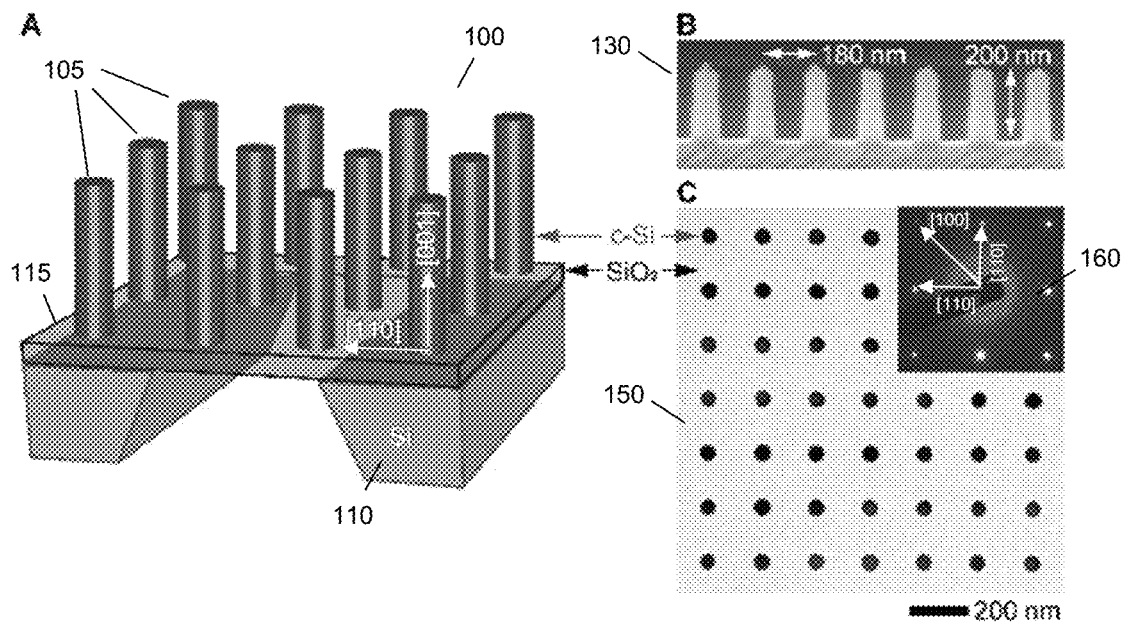
FIG. 1 illustrating: (A) a schematic of a test sample used for etching, (B) a side-view of the SEM image, and (C) a top-down TEM image showing a 7×7 array of equally space c-Si nanowires, in accordance with embodiments of the invention.

FIG. 1A illustrates a schematic of a test sample of crystalline silicon (c-Si) that may be used for etching. In particular, test sample 100 comprises equally spaced c-Si nanowires 105 that were provided on a Silicon Dioxide ($SiO_2$) film 115 which in turn is provided on a silicon substrate 110. In embodiments of the invention, the equally spaced c-Si nanowires 105 comprise of a densely packed array of (100) cylindrical Si nanowires fabricated on top a free standing $SiO_2$ film.

FIG. 1B illustrates a side-view of a scanning electron microscope (SEM) image 130 of the test sample 100. This SEM image illustrates that the height of each of the c-Si nanowires is approximately 200 nanometers, that the centre-to-centre spacing between each of the c-Si nanowires is approximately 180 nanometers and each of them have a diameter of 45±5 nanometers. FIG. 1C illustrates a top-down view of a transmission electron microscope (TEM) image of test sample 100. As can be seen from TEM image 150, the centre-to-centre spacing between each of the c-Si nanowires is approximately 180 nanometers. One skilled in the art will recognize that c-Si nanowires having various other heights, diameters or centre-to-centre spacing may be used without departing from the invention.

Further, a selected area electron diffraction (SAED) image 160 of c-Si nanowires 105 show that the c-Si nanowires 105 are monocrystalline and are all oriented in the [001] direction such that the diagonal arrow in image 160 represents the direction of the (100) crystallographic plane while the vertical and horizontal arrows represent the direction of the (110) crystallographic planes.

Figure 2:
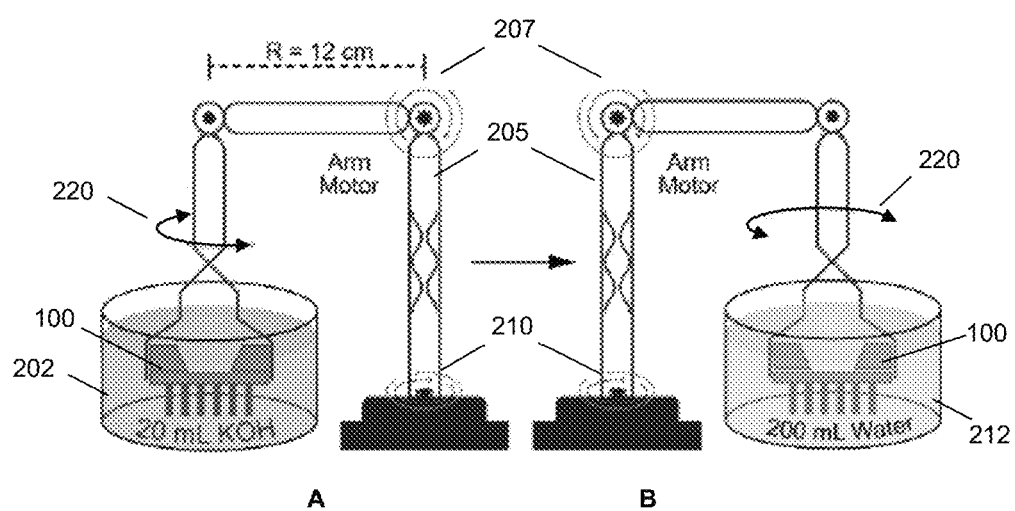
FIG. 2 illustrating a schematic showing the operation of a two-motor robotic arm that may be configured to perform etching and quenching processes in accordance with embodiments of the invention.

FIG. 2 illustrates a system showing the operation of wet-etching setup comprising a two-motor robotic arm that may be configured to perform etching and quenching processes of test sample 100 in accordance with embodiments of the invention. In embodiments of the invention, robotic arm 205 may comprise of two motors, motor 207 that is configured to lift a test sample out from one container and dip into another container; and motor 210 that is configured to move the sample from one container to another container and turn in an oscillatory manner 220 with a predetermined frequency and amplitude within a given container.

In FIG. 2A, robotic arm 205 is configured to perform the etching step by transporting and dipping test sample 100 into etching solution 202 for a predetermined etching period. In embodiments of the invention, etching solution 202 may comprise 20 mL of potassium hydroxide (KOH). Once the predetermined etching period has passed, robotic arm 205 will then move test sample 100 out from etching solution 202 and quenches it in beaker 212 that is filled with 200 mL of deionized water. This is illustrated in FIG. 2B. Once quenched, robotic arm 205 then moves the test sample out from beaker 212 and rinses it in another beaker (not shown) filled with 200 mL of deionized water. One skilled in the art will recognize that any volume of KOH etching solution or deionized water may be used in the setup illustrated in FIG. 2 without departing from the invention.

In accordance with embodiments of the invention, in order to selectively switch the fast-wet-etching direction of crystalline silicon, c-Si between a (100) crystallographic plane of the c-Si and a (110) crystallographic plane of the c-Si when the etching solution comprises a solution that wet-etches the c-Si along the (100) crystallographic plane at a faster rate than the c-Si along the (110) crystallographic plane, the rate of removal of etching byproducts from the (110) crystallographic plane of the wet-etched c-Si was increased.

By improving the rate of removal of the etching byproducts from the (110) crystallographic plane of the wet-etched c-Si, this caused the wet-etching of the c-Si along the (110) crystallographic plane to occur at a faster rate than the wet-etching of the c-Si along the (100) crystallographic plane of the c-Si.

It is useful to note at this stage that it is known to one skilled in the art that when an etching solution comprising 10-60% (w/v) KOH solution and having a temperature between 40-90° C. is used, this etching solution will wet-etch the c-Si anisotropically, along the (110) crystallographic plane at a faster rate than the c-Si along the (100) crystallographic plane—regardless whether the etching solution is agitated or kept still.

In an embodiment of the invention, an etching solution comprising a 1% (w/v) KOH solution at room temperature was utilized as it was found to wet-etch the c-Si anisotropically, along the (100) crystallographic plane at a faster rate than the c-Si along the (110) crystallographic plane when used in accordance with normal practices. One skilled in the art will recognize that in accordance with embodiments of the invention, the etching solution may have a concentration in the range between 1-10% (w/v) KOH and may be maintained at a temperature range between 20° C. and 30° C. When the KOH solution was used, the primary etching byproduct that forms during the etching process is orthosilicic acid, $Si(OH)_4$. These $Si(OH)_4$ byproducts transiently binds on the c-Si surface before it leaves the surface. The etch by-products which are bound to the surface screen the c-Si surface and limits the access of hydroxyl ions ($OH^-$) present in the etching solution which is responsible for etching the surface of the c-Si. One skilled in the art will recognize that other inorganic etchants such as, but not limited to, sodium hydroxide (NaOH), may be used as the etching solution without departing from the invention.

When the rate of the removal of these $Si(OH)_4$ byproducts from the (110) crystallographic plane of the wet-etched c-Si was increased by agitating/oscillating the test samples, the wet-etching of the c-Si along the (110) crystallographic plane occurred at a faster rate than the wet-etching of the c-Si along the (100) crystallographic plane. In other embodiments of the invention, the rate of the removal of these $Si(OH)_4$ by-products from the (110) crystallographic plane of the wet-etched c-Si may be increased by agitating the etching solution around the test samples and this may be done by magnetically stirring and/or ultrasonically agitating the etching solution. One skilled in the art will recognize that other methods of agitating and/or disturbing the etching solution around the test samples may be used without departing from this invention.

When both the KOH solution and the test samples were kept stationary, the removal rate of the $Si(OH)_4$ byproduct from the Si (110) crystallographic plane was found to be lower because the byproduct tends to form a stronger bond to the (110) crystallographic surface (i.e. at 7.1 kcal/mol) as compared to the bond of the byproduct to the (100) crystallographic surface (i.e. at 4.7 kcal/mol). Hence, under this condition, the KOH solution will wet-etch the c-Si along the (100) crystallographic plane at a faster rate than the c-Si along the (110) crystallographic plane.

Experimental Setup

An experiment was carried out to show that when the test samples are agitated/oscillated through an etching solution comprising a KOH solution having low concentration levels (e.g. <10% (w/v), preferably between 1-4% (w/v)) and at a temperature range between 20° C.-30° C., preferably 22° C., the wet etching process will produce nanowires with (110) facets; and that when the etching solution and the test samples were kept stationary, the wet etching process will produce nanowires with (100) facets. This occurs as the rate of the removal of the $Si(OH)_4$ byproducts from the (110) crystallographic plane of the wet-etched c-Si was faster than the rate of the removal of the byproducts from the (100) crystallographic plane when the test samples were agitated or oscillated in the etching solution.

Materials:

In the experiment, etching solutions were prepared from the following stock pellets or solutions: potassium hydroxide (KOH) (pellets, 85% purity, Cat. No. 306568, Sigma-Aldrich Co. LLC, St. Louis, USA), tetramethylammonium hydroxide (TMAH) (25% stock solution, Cat. No. 331635, VWR International LLC, Radnor, PA, USA), and hydrofluoric acid (HF) (48% stock solution, Cat. No. 339261, Sigma-Aldrich Co. LLC, St. Louis, USA). ACS-grade DI water (Cat. No. 320072, Sigma-Aldrich Co. LLC, St. Louis, USA) was used to prepare all the solutions used in this study.

10% (w/v) aqueous KOH solutions were prepared by mixing 5 g, of KOH pellets in 50 mL of deionized (DI) water while KOH solutions of lower concentrations, e.g. 1-4% (v/v) were obtained by diluting the 10% (w/v) KOH solution in DI water. A low concentration of 0.25% (v/v) HF was obtained by diluting 250 μL of 48% HF into 50 mL DI water.

Fabrication of nanowire array: Test samples (e.g. test sample 100 in FIG. 1) of crystalline silicon (c-Si) nanowires were fabricated on standard silicon-on-insulator (SOI) wafers using immersion lithography techniques. The 501 wafers used consisted of a handle wafer, a $SiO_2$ film and a c-Si device layer on top of the $SiO_2$ film. Prior to any processing step, the device layer thickness was reduced to the desired height of the nanowires using mechanical polishing and the deposition of a thin $SiN_x$ layer on both sides of the wafer using low-pressure chemical vapour deposition (LPCVD). The device-side (front side) $SiN_x$ layer serves as a hard mask for dry etching during nanowire fabrication, whereas the backside layer works as a hard mask during wet-etching of the handle wafer for the $SiO_2$ membrane window release.

Experimental Steps:

Etch tests were done at room temperature (22° C.) using the custom-built robotic arm as illustrated in FIG. 2. The robotic arm was programmed to perform the etching in a series of three automated steps:

(1) Etching: transport and dip the samples into a beaker filled with 20 mL KOH solution for a pre-set etching time, (2) Quenching: transport and dip the samples into a beaker filled with 200 mL DI water for 10 s, and (3) Rinsing: transport the samples to another 200 mL DI water beaker and rinse for 50 s.

During the etching step, the arm was programmed to be stationary or to stir the test sample at a pre-set speed in an oscillatory manner. The frequency and amplitude of stirring during the etching were set at 1 Hz and 1.5 cm, respectively. During the quenching and rinsing steps, a bigger amplitude of almost twice of the etching was used. Furthermore, during the etching step, the stationary and stirred cases may be combined and looped for a desired number of cycles. One skilled in the art will recognize that the amount of etching solution, the amount of quenching solution, the amount of rinsing solution, and the amount of time taken for each step may be varied as required without departing from the invention.

Figure 3:
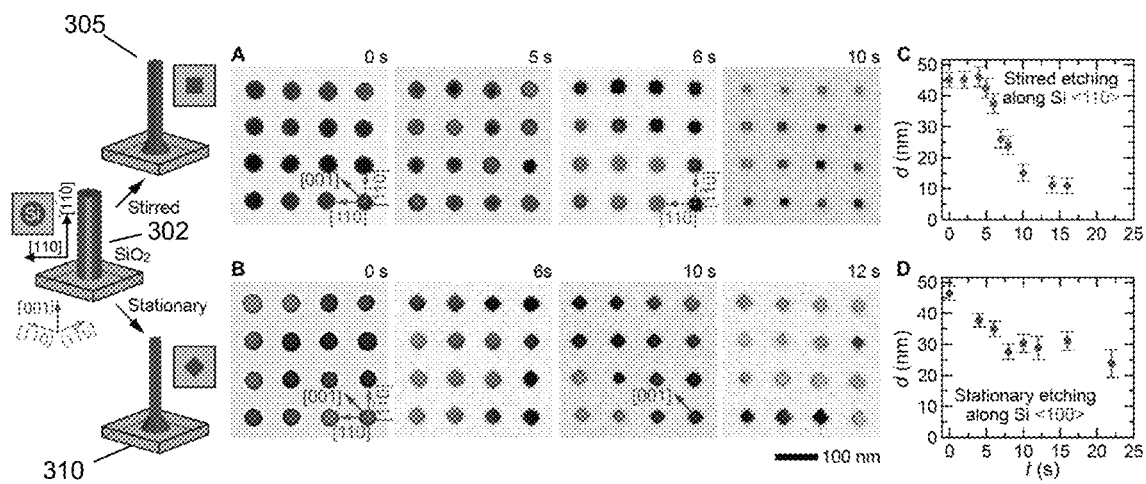
FIG. 3 illustrating TEM images over a fixed time period showing the effect of stirred and stationary wet-etching on 70-nm-tall nanowires in a 1% (w/v) KOH etching solution and the estimated average width of the nanowires along the various Si crystallographic directions in accordance with embodiments of the invention.

FIG. 3 illustrates top-down TEM images showing the effect of stirred and stationary etching on the c-Si nanowires in test sample 100 over a fixed time period, and the estimated average width (d) of the nanowires along the various Si crystallographic directions in accordance with embodiments of the invention. As can be seen from FIG. 3, each of the c-Si nanowires 302 (before etching) are orientated such that the diagonal arrow represents the direction of the (100) crystallographic plane while the vertical and horizontal arrows represent the direction of the (110) crystallographic planes.

FIG. 3B illustrates a series of TEM images when the etched c-Si nanowires were quenched at different time points and when the c-Si nanowires were etched in a 1% (w/v) KOH solution at room temperature under stationary conditions (i.e. the sample was not agitated or moved inside the solution throughout the etching process).

Figure 5:
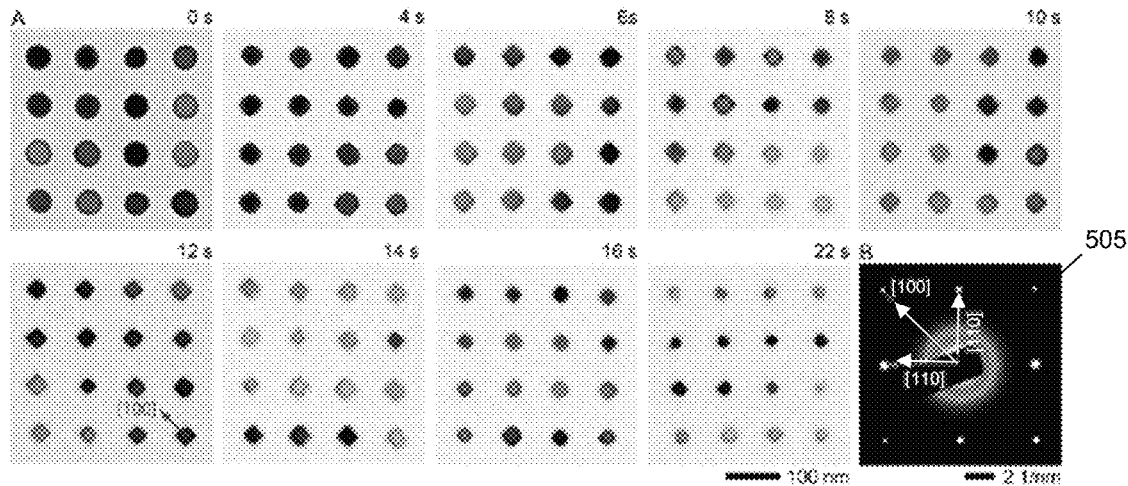
FIG. 5 illustrating detailed TEM images over a fixed time period showing the effect of stationary wet-etching on 70-nm-tall nanowires in a 1% (w/v) KOH etching solution in accordance with embodiments of the invention.

A more detailed image series of these TEM images are illustrated in FIG. 5. The TEM image series was acquired by quenching the reactions at different time points, between 0 seconds and 22 seconds. The series of TEM images shows that the etching of the nanowires starts with a roughening of their diagonal sidewalls (t=4 s, FIG. 5) from multiple facets in low- and high-index crystal planes. As etching progresses, Si (100) planes on the sidewall of the c-Si nanowires start to develop, indicating that (100) is the fast etching direction, and the profile of nanowires goes from circular to diamond-shaped, as seen in the top-down projected view at t=6 s. These diamond-shaped profiles are maintained all the way until the nanowires are fully etched and start disappearing in the etching solution at t=22 s. In particular, the SAED 505 of the nanowires in FIG. 5 show that the nanowires are single-crystalline and are oriented along the (001) direction. In conclusion, the TEM images in FIGS. 3B and 5 show that when the etching solution and test samples are kept stationary, the etching process, which uses an etching solution of 1% (w/v) KOH solution at room temperature, will produce nanowires with (100) facets. As known to one skilled in the art, when an etching solution comprising 10-60% (w/v) KOH solution at temperatures 40-90° C. is used, the wet-etching occurs along the (110) crystallographic plane of the c-Si nanowires at a faster rate than along the (100) crystallographic plane. It was expected that similar behaviour would occur at lower concentrations and temperatures, however, it was observed that the (100) crystallographic plane etches faster and produces (100) faceted diamond profile for a c-Si nanopillar array.

FIG. 3A illustrates a series of TEM images when the etched c-Si nanowires were quenched at different time points and when the c-Si nanowires were etched in a 1% (w/v) KOH solution at room temperature under stirring conditions (i.e. the sample was continuously moved back and forth parallel to the wafer plane inside the solution throughout the etching process).

It should be noted that, as known to one skilled in the art, in order to achieve a faster wet-etching rate along the (110) c-Si plane of the c-Si nanowires than along the (100) c-Si plane, the bulk c-Si etching of c-Si nanowires has to be carried out using KOH solutions with higher concentrations and at higher temperatures, e.g. KOH solutions at high concentrations (>10 wt. %) and at high temperatures (40-90° C.).

Figure 4:
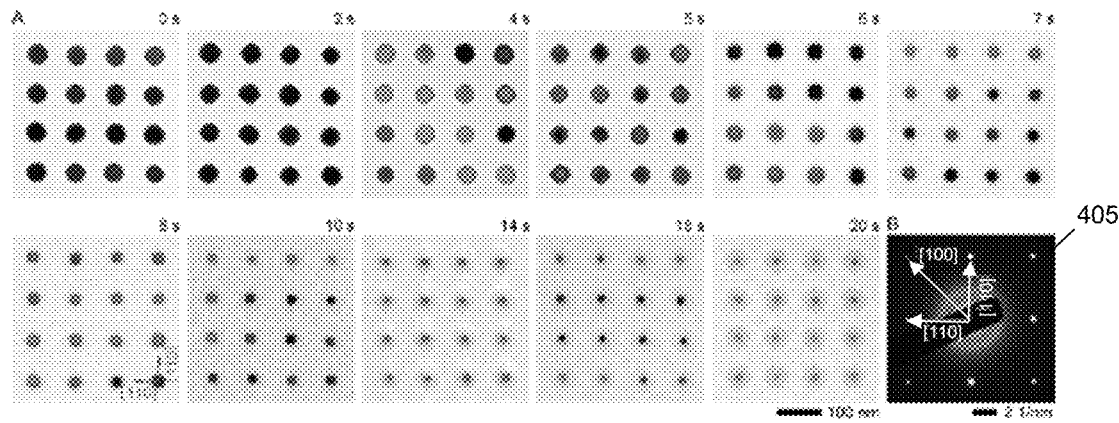
FIG. 4 illustrating detailed TEM images over a fixed time period showing the effect of stirred wet-etching on 70-nm-tall nanowires in a 1% (w/v) KOH etching solution in accordance with embodiments of the invention.

However, unlike the existing method described above to achieve a fast etching rate along the (110) c-Si plane, in accordance with an embodiment of the invention, the etching of the c-Si nanowires was carried out using the same etching solution, i.e. 1% (w/v) KOH solution at room temperature. In this method, the test sample was oscillated through the etching solution. As a result, as shown in the series of TEM images in FIG. 3A, it can be seen that the etching of the nanowires starts with a roughening of their sidewalls (t=5 s) from multiple facets in low- and high-index crystal planes. As the etching progresses, Si (110) planes on the sidewall of the c-Si nanowires start to develop, indicating that (110) is the fast etching direction, and the profile of nanowires goes from circular to square-shaped, as seen in the top-down projected view at t=6 s. These square-shaped profiles are maintained all the way until the nanowires are fully etched and start disappearing in the etching solution at t=20 s as illustrated by a detailed image series of these TEM images in FIG. 4. In particular, FIG. 4 illustrates a series of TEM images showing the effect of stirred/agitated wet-etching of 70-nm-tall nanowires in 1% (w/v) KOH solution at room temperature. The TEM image series was acquired by quenching the reactions at different time points between 0 and 20 seconds. The selected area electron diffraction (SAED) 405 of the nanowires show that all the nanowires are monocrystalline and oriented along the (001) direction. In conclusion, the TEM images show that when the etching solution is stationary and when the test samples are agitated/oscillated through the etching solution, the wet etching process will produce nanowires with (110) facets. This occurred as the rate of the removal of the $Si(OH)_4$ byproducts from the (110) crystallographic plane of the wet-etched c-Si was faster than the rate of the removal of the byproducts from the (100) crystallographic plane when the test samples were agitated or oscillated.

Figure 6:
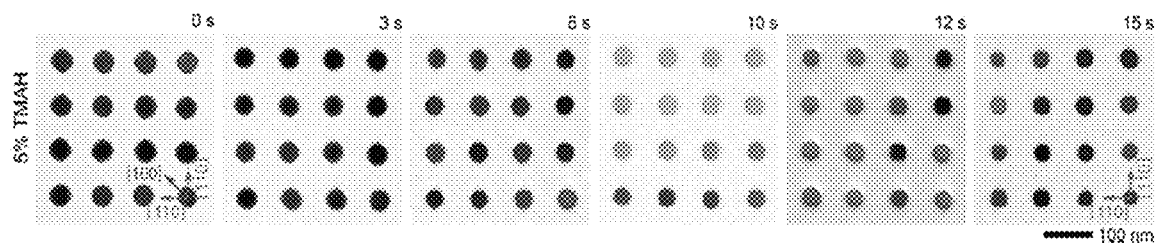
FIG. 6 illustrating detailed TEM images over a fixed time period showing the effect of stirred wet-etching on 70-nm-tall nanowires in a 5% (w/v) TMAH etching solution in accordance with embodiments of the invention.

In another embodiment of the invention, an etching solution comprising a 5% (v/v) tetramethylammonium hydroxide (TMAH) solution at room temperature was utilized, as the TMAH solution is known to sterically shield the surface of the c-Si during the etching process and as a result, inhibits the formation of etch byproducts clustering on the surface of the wet-etched c-Si. In particular, FIG. 6 illustrates a series of TEM images showing the wet etching of 70-nm-tall nanowires in 5% (v/v) TMAH solution at room temperature. The TEM image series was acquired by quenching the reactions at different time points between 0 and 15 seconds. FIG. 6 shows that facets formed along the Si (110) crystallographic planes when samples are etched in TMAH solution.

Figure 7:
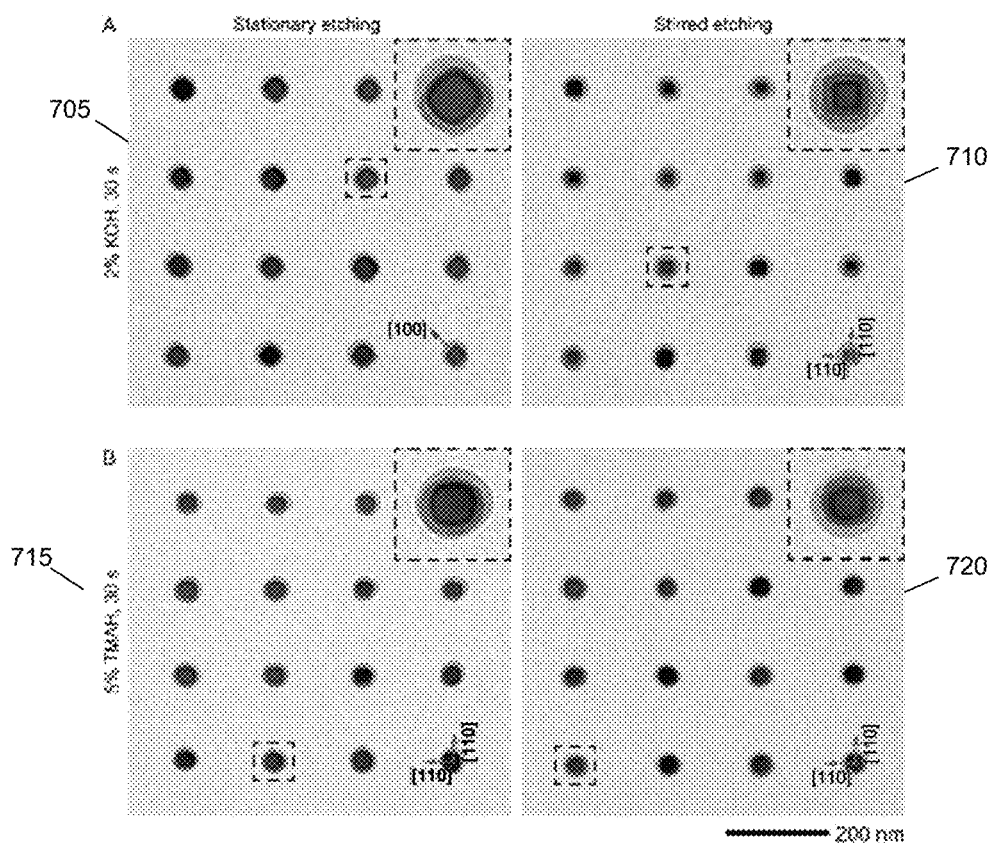
FIG. 7 illustrating TEM images showing the effect of stirred and stationary etching and the differences in anisotropic etching between KOH and TMAH over a fixed time period in accordance with embodiments of the invention.

FIG. 7 illustrates the differences in the anisotropic etching between an etching solution comprising 2% (w/v) KOH solution and an etching solution comprising 5% (v/v) TMAH solution when the samples are agitated/stirred and kept stationary. As illustrated in image 705 of FIG. 7A, when a test sample is kept stationary in an etching solution comprising 2% (w/v) KOH solution, wet-etching occurs along the (100) crystallographic plane of the c-Si nanowires at a faster rate than along the (110) crystallographic plane. However, when the test sample is agitated/stirred in an etching solution comprising 2% (w/v) KOH solution, the wet-etching tends to occur along the (110) crystallographic plane of the c-Si nanowires at a faster rate than along the (100) crystallographic plane. This is illustrated in image 710.

Conversely, when an etching solution comprising 5% (v/v) TMAH solution is used to wet-etch a test sample, the etching of the test samples occur along the (110) crystallographic plane of the c-Si nanowires at a faster rate than the (100) crystallographic plane regardless whether the test sample is kept stationary; or whether the test sample is agitated/stirred. This is illustrated in images 715 and 720 of FIG. 7B, respectively. This occurred because TMA+cations of TMAH sterically screen the c-Si etching surface and the etch byproducts that formed near the etching surface cannot bind/cluster on the etching surface, and so stirring does not have any effect on byproduct removal and hence switching of anisotropy.

Figure 8:
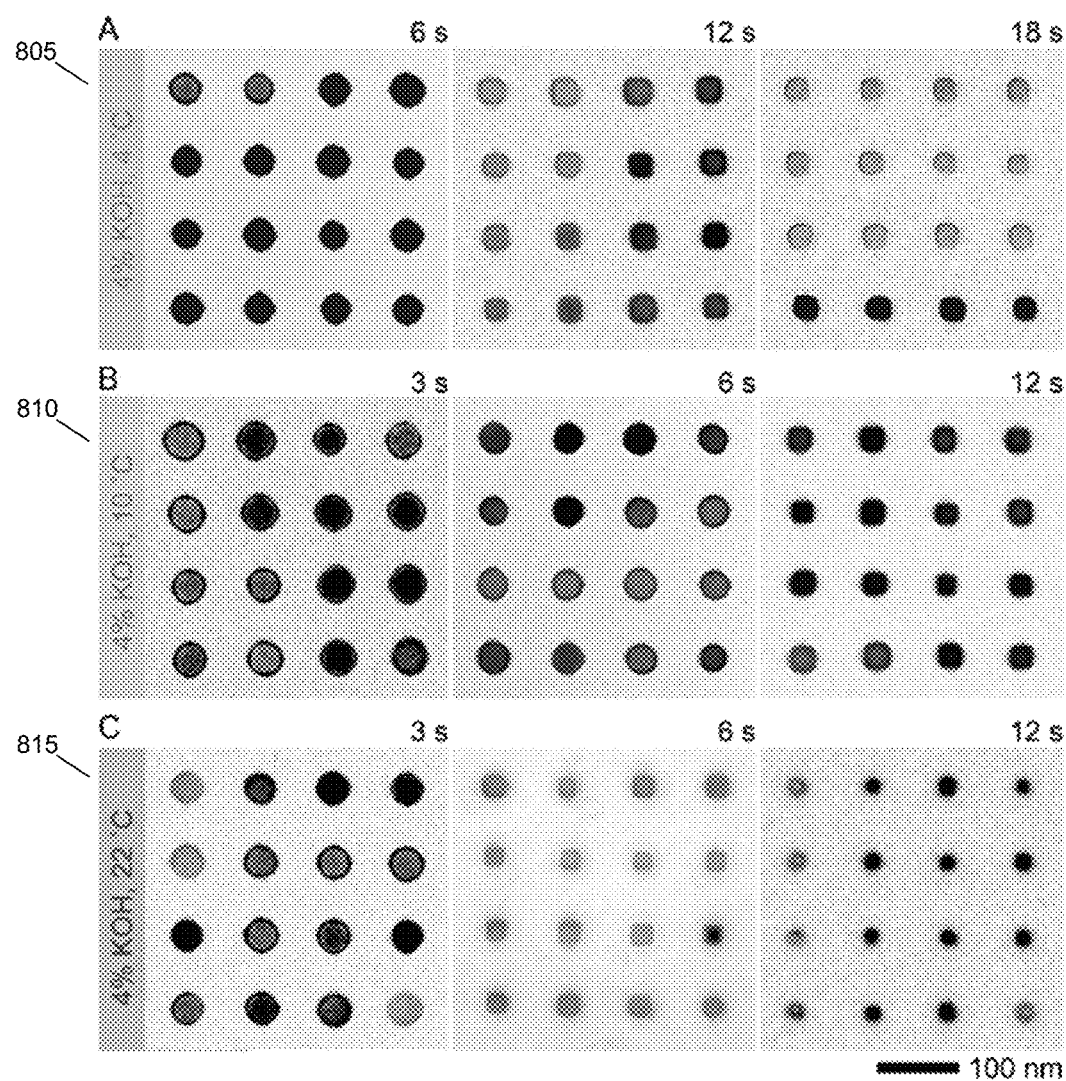
FIG. 8 illustrating TEM images showing the effect of anisotropic etching at different temperatures using a 4% (w/v) KOH etching solution.

FIG. 8 illustrates the effect of anisotropic etching across different temperatures when the etching solution comprises 4% (w/v) KOH solution and samples were constantly stirred during the etching. In particular, FIG. 8A shows a series of images 805 at 4° C. at 6 second, 12 second and 18 second time stamps, FIG. 8B shows a series of images 810 at 10° C. at 3 second, 6 second and 12 second time stamps and FIG. 8C shows a series of images 815 at 22° C. at 3 second, 6 second and 12 second time stamps. Images 805-815 show that although the etching rate increases when the temperature increases, the anisotropy of the etching did not change, i.e. the wet-etching occurred at a faster rate along the (110) crystallographic plane of the c-Si nanowires.

In yet another embodiment of the invention, c-Si nanowires with circular cross-sections were etched by controlling the anisotropic etching of the c-Si nanowires when an etching solution comprising 1% (w/v) KOH solution at room temperature was used. It should be noted that when Si nanowires are wet-etched, the etchant will inadvertently interact and etch the nanostructures from the top, shortening their height.

Figure 9:
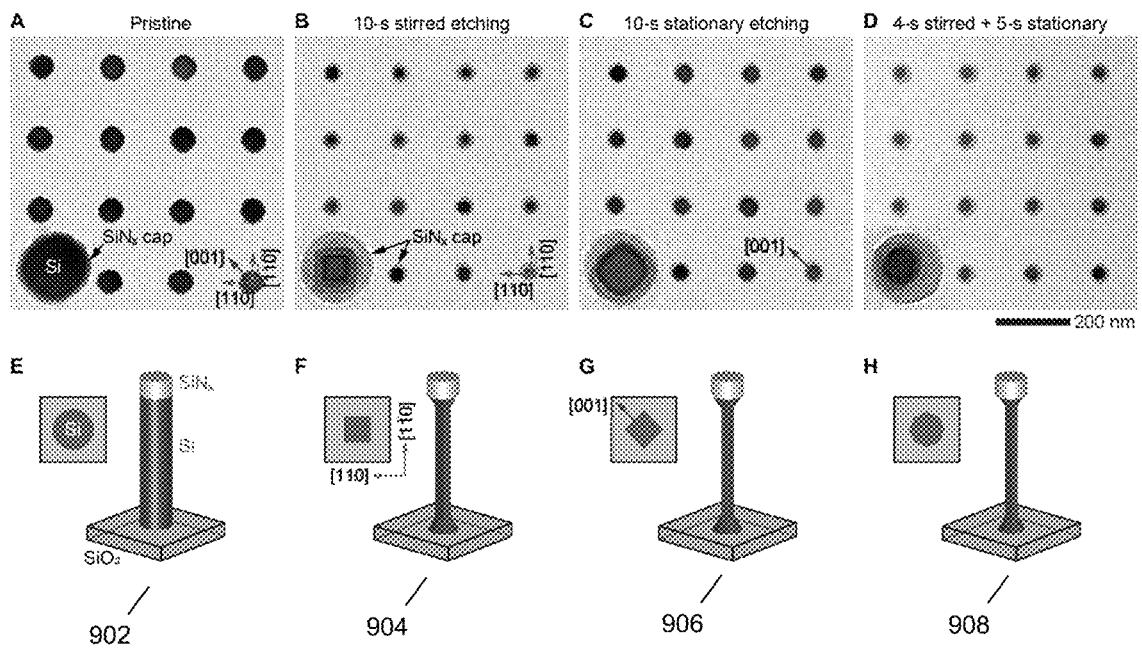
FIG. 9 illustrating the fabrication of vertical circular nanowires by cycling through stirred and stationary modes of etching in accordance with embodiments of the invention.

To prevent this, the Si nanowires were capped with 30-nm-thick $SiN_x$ as shown in FIG. 9A. Once the experiment was carried out, it was verified that the capping of the Si nanowires does not affect the observed anisotropy both for stirred (see FIG. 9B) and stationary (FIG. 9C) etching processes. As a result of the controlled switching between stationary and stirred etching conditions, it was possible to switch the etch direction from the {110} to the {100} planes as depicted in images 1002, 1004, 1006, and 1008 in FIG. 9E-H. FIG. 9D shows the nanowire array after it had been etched for 4 seconds under stirred etching conditions (i.e. to increase the rate of removal of etching byproducts from the (110) crystallographic plane of the wet-etched c-Si), followed by a further 5 seconds of etching under stationary conditions.

The resulting circular top-down profiles shown in FIG. 9D reveal that the resulting nanowires are cylindrical in shape, meeting the key requirement for the channel materials to be used in the next generation vertical GAAFETs.

Figure 10:
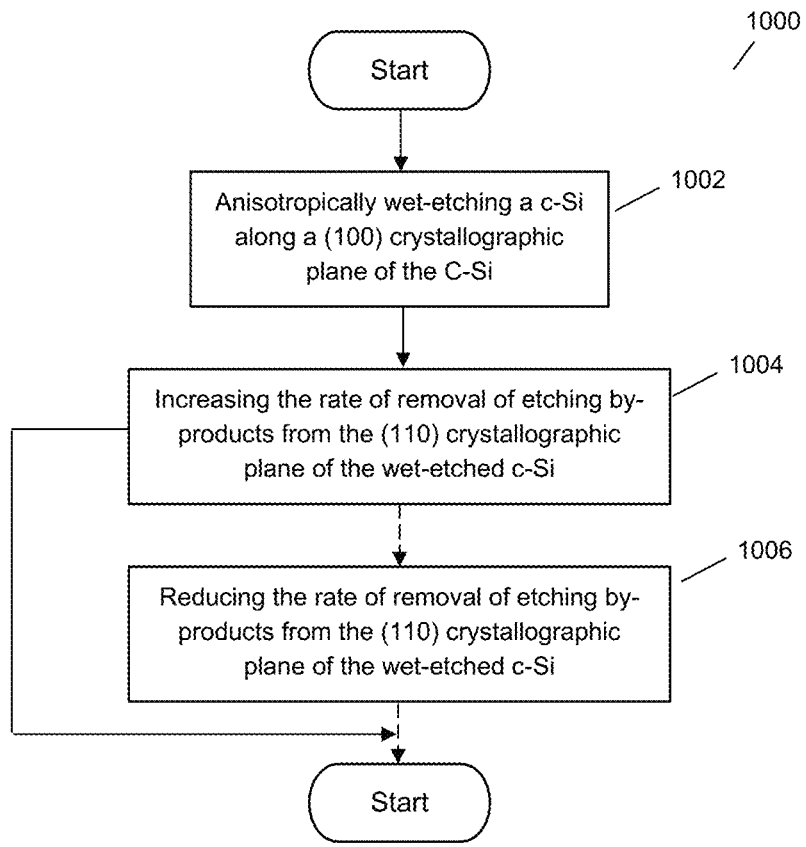
FIG. 10 illustrating a process for controlling directionality of fast-wet-etching of crystalline silicon, c-Si in accordance with embodiments of the invention.

FIG. 10 illustrates a process 1000 for controlling the directionality of fast-wet-etching of crystalline silicon, c-Si. Process 1000 begins at step 1002 whereby process 1000 anisotropically wet-etches the c-Si along a (100) crystallographic plane of the c-Si using an etching solution that wet-etches the c-Si along the (100) crystallographic plane at a faster rate than the c-Si along a (110) crystallographic plane of the c-Si. An example of such an etching solution would be a 1% (w/v) KOH solution at room temperature. Process 1000 may then end.

When the directionality of the fast-wet-etching of the c-Si is to be switched, process 1000 then proceeds to step 1004. At step 1004, the rate of removal of etching by-products from the (110) crystallographic plane of the wet-etched c-Si is increased. When this happens, the c-Si along the (110) crystallographic plane wet-etches at a faster rate than the wet-etching of the c-Si along the (100) crystallographic plane of the c-Si. Process 1000 may then end.

Optionally, if process 1000 is to be used to generate a circular profile of c-Si nanowires, process 1000 may instead proceed to step 1006 after step 1004. At step 1006, process 1000 reduces the rate of removal of etching byproducts from the (110) crystallographic plane of the wet-etched c-Si to cause the wet-etching of the c-Si along the (110) crystallographic plane to be at a slower rate than the wet-etching of the c-Si along the (100) crystallographic plane of the c-Si. Process 1000 then ends.

Figure 11:
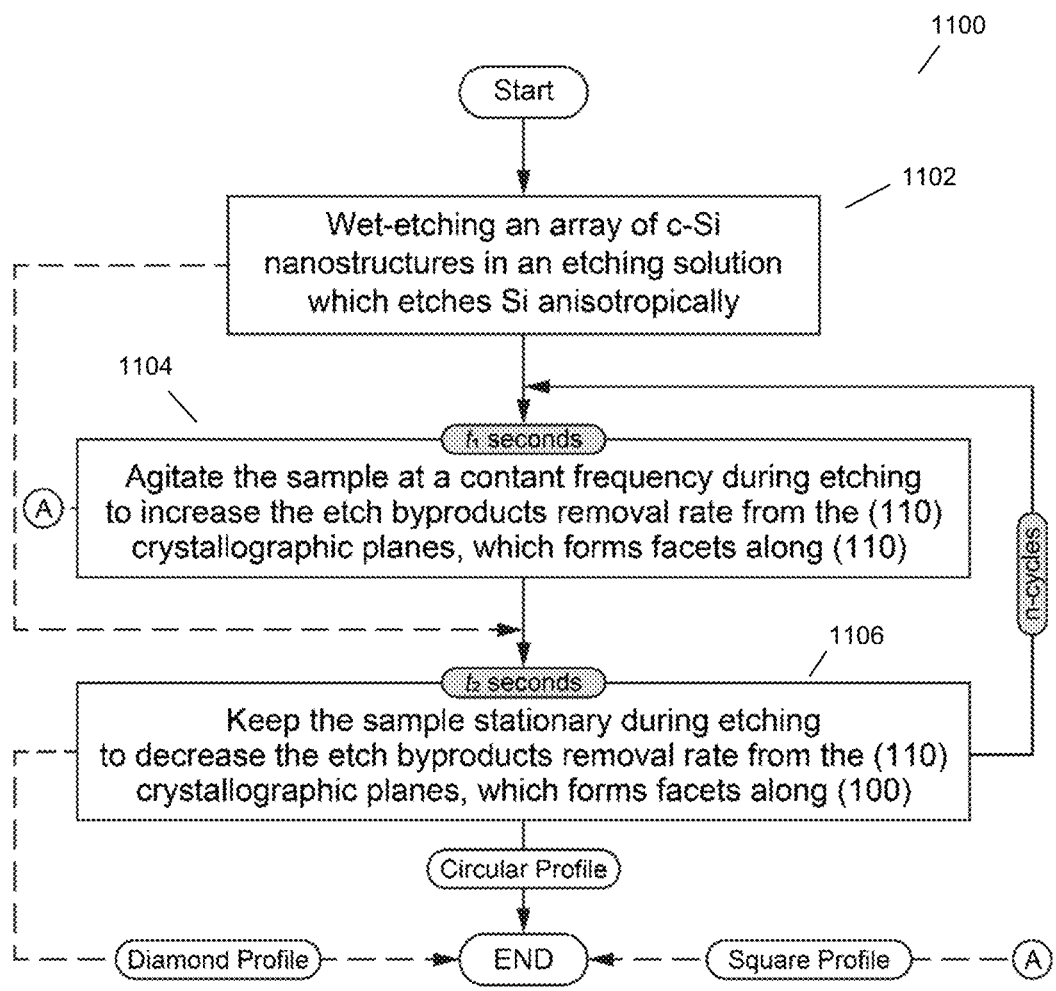
FIG. 11 illustrating a process for forming c-Si nanowires having a diamond profile or a square profile in accordance with embodiments of the invention

FIG. 11 illustrates a process 1100 for controlling the directionality of fast-wet-etching of crystalline silicon, c-Si. Process 1100 begins at step 1102 whereby an array of c-Si nanostructure is etched in an etching solution which etches c-Si anisotropically. An example of such an etching solution would be a 1% (w/v) KOH solution at room temperature. At step 1102, if the samples are kept stationary during the whole etching process, process 1100 proceeds to step 1106 where the etch rate of the c-Si along the (110) crystallographic plane decreases due to transient accumulation of etch byproducts on the (110) crystallographic plane. This produces facets along the (100) crystallographic plane. Process 1100 may then end here and the resulting profile of the c-Si nanowires will be diamond shaped.

Conversely, at step 1102, if the samples are agitated/stirred during the whole etching process at a constant frequency in an oscillatory manner, process 1102 then proceeds to step 1104 instead where the etch rate of the c-Si along the (110) crystallographic plane increases due to fast removal of etch byproducts on the (110) crystallographic plane. This produces facets along the (110) crystallographic plane. Process 1100 may then end here, and the resulting profile of the c-Si nanowires will be square shaped.

Optionally, if process 1100 is to be used to generate c-Si nanowires having a circular profile, process 1100 may instead proceed to step 1106 from step 1104 after spending $t_1$ seconds at step 1104. Process 1100 then continues at step 1106 for $t_2$ seconds. Process 1100 then may end here with c-Si nanowires having a circular profile or steps 1104 and 1106 may be repeated for n-cycles depending on the desired diameter of the nanowires.

Numerous other changes, substitutions, variations and modifications may be ascertained by one skilled in the art, and it is intended that the present invention encompass all such changes, substitutions, variations, and modifications as falling within the scope of the appended claims.

The invention claimed is:

1. A method for controlling directionality of fast-wet-etching of crystalline silicon, c-Si, the method comprising:
    anisotropically wet-etching the c-Si along a first crystallographic plane of the c-Si using an etching solution that wet-etches the c-Si along the crystallographic plane at a faster rate than the c-Si along a second crystallographic plane of the c-Si, wherein the etching solution comprises potassium hydroxide (KOH) and the etching byproducts from the wet-etched c-Si comprises orthosilicic acid, $Si(OH)_4$, and wherein the KOH solution comprises concentration levels <10% (w/v), and is maintained at a temperature range between 20° C.-30° C.; and
    increasing the rate of removal of etching byproducts from the second crystallographic plane of the wet-etched c-Si to cause the wet-etching of the c-Si along the second crystallographic plane to be at a faster rate than the wet-etching of the c-Si along the first crystallographic plane of the c-Si.

2. The method according to claim 1 wherein the step of increasing the rate of removal of the etching byproducts from the second crystallographic plane of the wet-etched c-Si comprises:
    agitating the etching solution such that the etching solution fluid contacts the c-Si along a direction parallel to the second crystallographic plane of the c-Si.

3. The method according to claim 1 wherein the step of increasing the rate of removal of the etching byproducts from the second crystallographic plane of the wet-etched c-Si comprises:
    applying an oscillatory force to the c-Si such that the c-Si oscillates for part of the time along a direction parallel to the second crystallographic plane of the c-Si.

4. The method according to claim 1 further comprising the step of:
    reducing the rate of removal of etching byproducts from the second crystallographic plane of the wet-etched c-Si to cause the wet-etching of the c-Si along the second crystallographic plane to be at a slower rate than the wet-etching of the c-Si along the first crystallographic plane of the c-Si.

5. A system for controlling directionality of fast-wet-etching of crystalline silicon, c-Si, the system comprising:
    a wet-etching setup configured to:
        anisotropically wet-etch the c-Si along a first crystallographic plane of the c-Si using an etching solution that wet-etches the c-Si along the first crystallographic plane at a faster rate than the c-Si along a second crystallographic plane of the c-Si, wherein the etching solution comprises potassium hydroxide (KOH) and the etching byproducts from the wet-etched c-Si comprises orthosilicic acid, $Si(OH)_4$, and wherein the KOH solution comprises concentration levels <10% (w/v), and is maintained at a temperature range between 20° C.-30° C.; and
        increase the rate of removal of etching byproducts from the second crystallographic plane of the wet-etched c-Si to cause the wet-etching of the c-Si along the second crystallographic plane to be at a faster rate than the wet-etching of the c-Si along the first crystallographic plane of the c-Si.

6. The system according to claim 5 wherein the increasing of the rate of removal of the etching byproducts from the second crystallographic plane of the wet-etched c-Si comprises the wet-etching setup being further configured to:
    agitate the etching solution such that the etching solution fluid contacts the c-Si along a direction parallel to the second crystallographic plane of the c-Si.

7. The system according to claim 5 wherein the increasing of the rate of removal of the etching byproducts from the second crystallographic plane of the wet-etched c-Si comprises the wet-etching setup being further configured to:
    apply an oscillatory force to the c-Si such that the c-Si oscillates for part of the time along a direction parallel to the second crystallographic plane of the c-Si.

8. The system according to claim 5 wherein the wet-etching setup is further configured to:
    reduce the rate of removal of etching byproducts from the second crystallographic plane of the wet-etched c-Si to cause the wet-etching of the c-Si along the second crystallographic plane to be at a slower rate than the wet-etching of the c-Si along the first crystallographic plane of the c-Si.

\* \* \* \* \*